United States Patent
Amelung et al.

(10) Patent No.: US 9,504,125 B2
(45) Date of Patent: Nov. 22, 2016

(54) LIGHTING MODULE WITH OPTIMIZED LIGHT OUTPUT

(71) Applicant: TRIDONIC GMBH & CO. KG, Dornbirn (AT)

(72) Inventors: Joerg Amelung, Dresden (DE); Michael Eritt, Dresden (DE); Christian Kirchhof, Dresden (DE)

(73) Assignee: TRIDONIC GMBH & CO. KG, Dornbirn (AT)

(*) Notice: Subject to any disclaimer, the term of this patent is extended or adjusted under 35 U.S.C. 154(b) by 0 days.

(21) Appl. No.: 14/439,150

(22) PCT Filed: Oct. 29, 2013

(86) PCT No.: PCT/EP2013/072552
§ 371 (c)(1),
(2) Date: Apr. 28, 2015

(87) PCT Pub. No.: WO2014/067917
PCT Pub. Date: May 8, 2014

(65) Prior Publication Data
US 2015/0296590 A1    Oct. 15, 2015

(30) Foreign Application Priority Data
Oct. 29, 2012  (DE) .......... 10 2012 219 704

(51) Int. Cl.
*H05B 33/28*  (2006.01)
*H01L 51/52*  (2006.01)
(Continued)

(52) U.S. Cl.
CPC ........... *H05B 33/28* (2013.01); *H01L 51/5209* (2013.01); *H01L 51/5225* (2013.01); *H01L 51/5271* (2013.01); *H05B 33/10* (2013.01);
(Continued)

(58) Field of Classification Search
CPC ............ F21V 23/005; F21V 23/02; F21Y 2105/001; F21Y 2101/02; H05B 33/0821
See application file for complete search history.

(56) References Cited

U.S. PATENT DOCUMENTS

2006/0176421 A1    8/2006  Utsumi et al.
2010/0127617 A1*   5/2010  Hayafuji ............. H01L 51/5212
                                                            313/504

(Continued)

FOREIGN PATENT DOCUMENTS

CN    1836468      9/2006
CN    102034846    4/2011
(Continued)

OTHER PUBLICATIONS

International Search Report for PCT/EP2013/072552, English translation attached to original, Both completed by the European Patent Office on Mar. 27, 2014, 7 Pages.
(Continued)

*Primary Examiner* — Donald Raleigh
*Assistant Examiner* — Kevin Quarterman
(74) *Attorney, Agent, or Firm* — Brooks Kushman P.C.

(57) ABSTRACT

A lighting module including a plate-type active element having two electrode layers and a light-emitting layer located between the electrode layers, and having a transparent, plate-type support element, on which the active element is located, at least the electrode layer facing the support element being transparent. In the lighting module, the transparent electrode layer has a structure with a thickness that varies periodically.

12 Claims, 2 Drawing Sheets

(51) Int. Cl.
*H05B 33/10* (2006.01)
*H05B 33/14* (2006.01)

(52) U.S. Cl.
CPC ........... *H05B 33/14* (2013.01); *H01L 51/5212* (2013.01); *H01L 2251/5361* (2013.01); *H01L 2251/558* (2013.01)

(56) References Cited

U.S. PATENT DOCUMENTS

| | | |
|---|---|---|
| 2011/0248309 A1 | 10/2011 | Han et al. |
| 2012/0126263 A1 | 5/2012 | Chao |
| 2013/0016494 A1* | 1/2013 | Speier ............... H01L 33/58 362/84 |
| 2013/0313540 A1 | 11/2013 | Kristukat |

FOREIGN PATENT DOCUMENTS

| | | |
|---|---|---|
| DE | 102011003641 | 8/2012 |
| EP | 1566854 | 8/2005 |
| JP | H02309592 | 12/1990 |
| JP | 4462074 | 5/2010 |
| WO | 2011161998 | 12/2011 |

OTHER PUBLICATIONS

Chinese Office Action for Chinese Application No. CN 201380058495.7, Completed by the Chinese Patent Office, Dated Apr. 28, 2016, 6 Pages.

Chinese Search Report for Chinese Application No. CN 201380058495.7, Completed by the Chinese Patent Office, Dated Apr. 14, 2016, 2 Pages.

* cited by examiner

LIGHTING MODULE WITH OPTIMIZED LIGHT OUTPUT

CROSS-REFERENCE TO RELATED APPLICATION

This application is the U.S. national phase of PCT Application No. PCT/EP2013/072552 filed on Oct. 29, 2013, which claims priority to DE Patent Application No. 10 2012 219 704.4 filed on Oct. 29, 2012, the disclosures of which are incorporated in their entirety by reference herein.

The present invention relates to a lighting module in accordance with the preamble of claim 1, which has a plate-shaped, active element for light emission, said active element being arranged on a carrier element. The active element can be in particular an OLED (organic light-emitting diode) structure or a QLED (quantum-dot light-emitting diode) structure.

The development of novel light sources which can replace conventional light sources such as incandescent bulbs or fluorescent lamps owing to their improved properties has made significant progress in recent times. In addition to conventional light-emitting diodes (LEDs) which are substantially punctiform light sources, in this case in particular also OLEDs or QLEDs have taken center stage since novel flat light elements can be implemented on the basis of such structures. As a flat light-emitting element having a moderate luminance in comparison with a conventional LED, an OLED or QLED is ideally suited for the production of flat diffuse light sources. The application possibilities for such light sources are extremely varied, for which reason there has been a significant development in this field in recent years. Owing to its design, an OLED or QLED has the properties of a so-called Lambertian source having a constant luminance at any desired emission angles. Correspondingly, it is particularly well suited for forming large-area light sources.

Organic light-emitting diodes, in the same way as organic solar cells, are so-called thin-film components. In this case, very thin layers of organic material are deposited on a glass carrier, the so-called substrate. The individual layers can in this case be only a few nanometers thick. If an organic LED is used, the layers applied to the substrate form the abovementioned active element and have at least two mutually opposite electrode layers, between which one or more layers of organic material are arranged. When a voltage is applied, this organic material emits the light. Necessarily, one of the two electrodes, usually that which is arranged on the glass carrier, needs to be transparent in this case. In order to form such a transparent electrode, usually a transparent conductive oxide (TCO), for example indium-tin-oxide (ITO) is used correspondingly.

In the case of the above-described design with the transparent electrode, the organic materials or organic layers, in the same way as the transparent electrode, have a higher refractive index than the glass carrier or the substrate. This can result in a total internal reflection of the light at the interface between the organic layer and the electrode, but in particular at the interface between the electrode and the substrate or glass carrier, wherein such reflected beams are then no longer usable for light emission and are correspondingly lost. Owing to these differences in refractive index, therefore, optical losses at the interfaces result, which lead to a reduced efficiency of the OLED. A comparable problem also results in the case of the QLEDs mentioned at the outset.

The present invention is therefore based on the object of improving the coupling-out of light in the case of such OLED or QLED structures in order to correspondingly increase the efficiency of such elements.

The object is achieved by a lighting module having the features of claim 1 and by a method for forming a lighting module as claimed in claim 10. Advantageous developments of the invention are the subject matter of the dependent claims.

The solution according to the invention is based on the concept of configuring the transparent electrode of the OLED structure in respect of its thickness in such a way that optimized light emission is achieved. In particular, the abovementioned total internal reflections at the interfaces between the organic layer and the electrode or between the transparent electrode and the carrier substrate are intended to be avoided. In contrast to previously known OLEDs, in which the transparent electrode was embodied as a layer of uniform thickness, provision is made in accordance with the invention for the layer now to be configured periodically with varying thickness. It has been demonstrated that in this case the light beams impinge on the interface predominantly at a more favorable angle and correspondingly the undesired total internal reflections can be avoided or at least partially suppressed.

In accordance with the invention, therefore, a lighting module is proposed which has a plate-shaped, active element, which has two electrode layers and one light-emitting layer arranged between the electrode layers, and a transparent plate-shaped carrier element, on which the active element is arranged, wherein at least the electrode layer facing the carrier element is transparent. In addition, in accordance with the invention, the transparent electrode layer is configured in such a way that it has a structuring of periodically varying thickness.

The structuring according to the invention of the electrode layer is preferably performed during the arrangement of the electrode layer on the carrier element. In this case, provision is particularly preferably made for the transparent electrode to be applied to the carrier element by deposition of a corresponding material, wherein the structuring is then achieved by the use of a correspondingly configured so-called shadow mask. This can have, for example, a grid structure so that the thickness of the electrode layer varies periodically along one direction. This is a very simple measure for achieving the desired structuring of the electrode layer so that the efficiency of the OLED or QLED can therefore be optimized with comparatively low levels of complexity. The transparent electrode layer is in this case designed to be flat on its side facing the carrier element or it bears flat against the carrier element.

The further layers of the active element can also be arranged on the transparent electrode layer by corresponding application or deposition. In this case, they preferably have a substantially constant thickness or they follow the structure of the transparent electrode which varies in thickness periodically. This entails the advantage that, owing to the uniform thickness in particular of the organic material nevertheless over the entire area, a substantially uniformly homogeneous light emission is achieved.

A particularly advantageous development of the invention can also consist in that a so-called metal grid is embedded in the transparent electrode layer. This is specially arranged conductor tracks or metal tracks, by means of which the uniform current flow over the entire area of the active element is optimized. This metal grid in this case compensates for the comparatively low conductivity of the transparent electrode.

Secondly, the metal tracks or conductor tracks of the grid are opaque and could correspondingly result in an impairment of the uniformity of the light emission of the lighting module. In accordance with an advantageous development, provision is therefore made for the conductor or metal tracks of the grid to be arranged precisely in those regions in which the electrode layer has an increased thickness. The electrode layer, owing to its varying thickness, acts as a lens-like optical element, which slightly deflects or diffracts the light beams in such a way that the metal grid has a less disruptive effect on the light emission. That is to say that, in this preferred embodiment, firstly the uniform current flow and correspondingly the light emission in the organic layer is optimized, and secondly the configuration according to the invention of the transparent electrode layer results in the metal grid having a less disruptive effect on the light emission.

In accordance with the invention, a method for constructing a flat lighting module is also proposed, in which a plate-shaped active element is arranged on a transparent, plate-shaped carrier element, said active element having two electrode layers and a light-emitting structure arranged between the electrode layers, wherein the electrode layer facing the carrier element is transparent and, in accordance with the invention, is applied by deposition onto the carrier element in such a way that the layer has a periodic structuring of varying thickness.

The invention will be explained in more detail below with reference to the attached drawing, in which.

Figure 4:
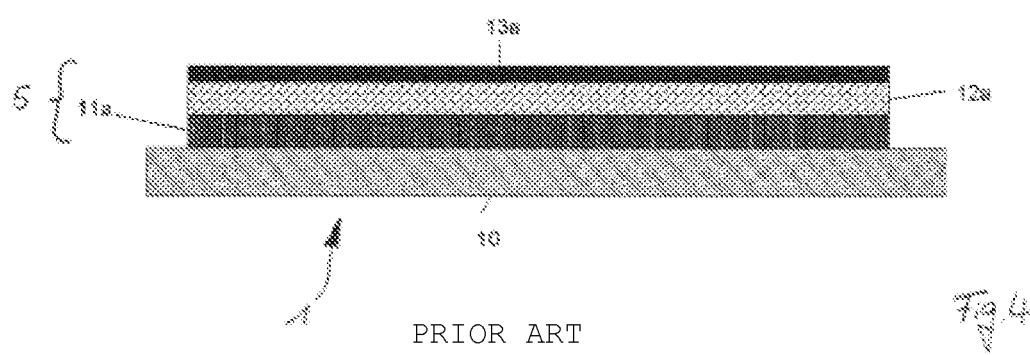
FIG. 4 shows the design of an organic LED corresponding to the prior art.

The problem on which the invention is based will be explained below firstly with reference to FIG. 4, which shows an OLED structure 1 corresponding to the prior art in a lateral sectional illustration. A flat transparent glass substrate 10 is used as carrier for the entire structure 1, with the further layers or structures being arranged on said glass substrate. In particular, the carrier substrate 10 acts as carrier for the so-called active element 5, which consists of a plurality of layers. In the exemplary embodiment illustrated, in this case organic layers 12a are arranged between two electrodes 11a and 13a. When a voltage is applied to the two electrodes 11a and 13a, the organic layers 12a generate light, which is intended to be emitted via the carrier substrate 10. At least one of the two electrode layers 11a, 13a, in this present case the electrode 11a, needs to be correspondingly transparent and is generally applied flat to the substrate 10 by suitable methods, for example by so-called sputtering. Then, the further layers 12a and 13a are applied.

The light emission of the illustrated structure therefore takes place by virtue of the fact that light is generated within the organic layers 12a and is emitted via the transparent electrode 11a and the carrier substrate 10. In this case, generally a transparent conductive oxide (TCO) which does have, however, in the same way as the organic materials or layers, a higher refractive index than the substrate 10, is used as the material for the transparent electrode 11a. Light beams which impinge on the interface between the transparent electrode 11a and the carrier substrate 11 at unfavorable angles can correspondingly be subjected to total internal reflection and are lost for the desired light emission. That is to say that in the configuration illustrated in FIG. 4 and known from the prior art, light losses may occur, which have a negative effect on the efficiency of the entire OLED.

Figure 1:
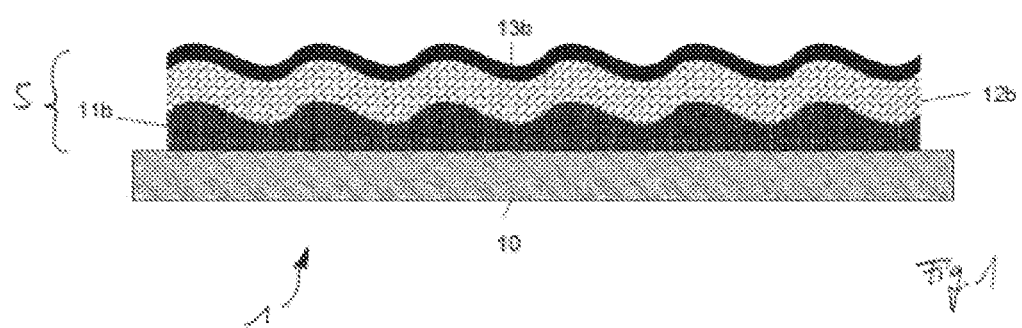
FIG. 1 shows a first exemplary embodiment of a lighting module according to the invention in a lateral sectional illustration.

In order to circumvent this problem, it is proposed to configure the layers arranged on the carrier substrate 10, in particular the transparent electrode layer, corresponding to the illustration in FIG. 1. It can be seen that in this case in particular the electrode layer 11b is no longer configured as a uniformly flat or planar layer, but instead has a structuring such that it varies periodically in terms of height or thickness. In the exemplary embodiment illustrated, the electrode layer 11b is in particular wavy.

This wavy structure is also impressed in the following layers, i.e. in the organic layers 12b and the electrode layer 13b, in the same way. This results from the fact that the organic layers 12b still have a constant thickness, which is advantageous insofar as the uniformity during generation of the light over the area of the OLED structure 1 is thus maintained.

The structuring of the transparent electrode 11b in this case results in said electrode diffracting the light beams in such a way that they impinge on the interface between the electrode layer 11b and the substrate 10 at a more favorable angle. The proportion of light beams which is subjected to total internal reflection at this interface decreases markedly and the efficiency of the light emission is correspondingly increased. In the same way, the structuring also has a favorable effect on the transfer of light from the organic layers 12b onto the electrode 11b. Owing to the difference in the refractive index, total internal reflection could occur at this interface too, but said total internal reflection is at least partially suppressed by the novel structuring of the layers of the OLED.

Figure 2:
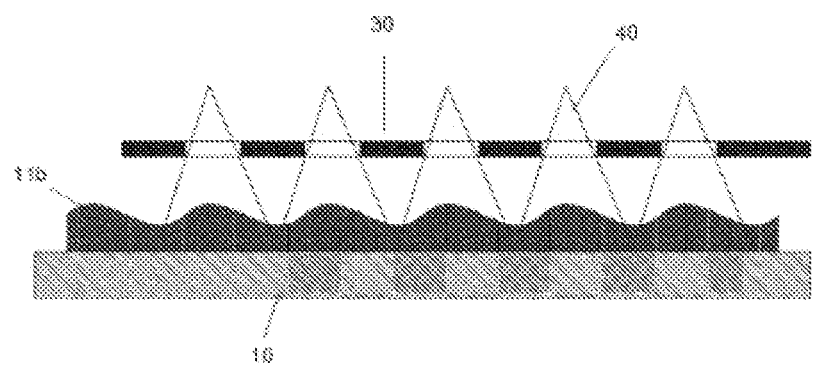
FIG. 2 shows an advantageous procedure for implementing the structuring of the transparent electrode according to the invention.

FIG. 2 shows a preferred procedure for forming the structuring according to the invention of the electrode layer 11b. This is generally applied by deposition of a suitable material, for example indium-tin-oxide (ITO) on the glass substrate 10. In accordance with the invention, provision is now made for the application to be performed with the aid of a so-called shadow mask 30, which is in the form of a grid with openings 40 uniformly spaced apart from one another in the exemplary embodiment illustrated. The material for forming the transparent electrode 11b is now output onto the glass substrate 10 exclusively via these openings 40, wherein the wave structure illustrated then results when selecting a corresponding spacing between the mask 30 and the glass substrate 10. That is to say that even in regions outside the openings 40, the deposition of the electrode material takes place on the glass substrate 10, wherein in this case there is then a reduced thickness, however. By virtue of this measure, therefore, the advantageous structuring of the electrode layer 11b can be achieved in a very simple but efficient manner. As already mentioned, by corresponding selection of the parameters, i.e. the spacing between the shadow mask and the substrate, the size and arrangement of the openings, the corresponding surface profile of the electrodes 11b can be adapted in a desired manner.

Figure 3:
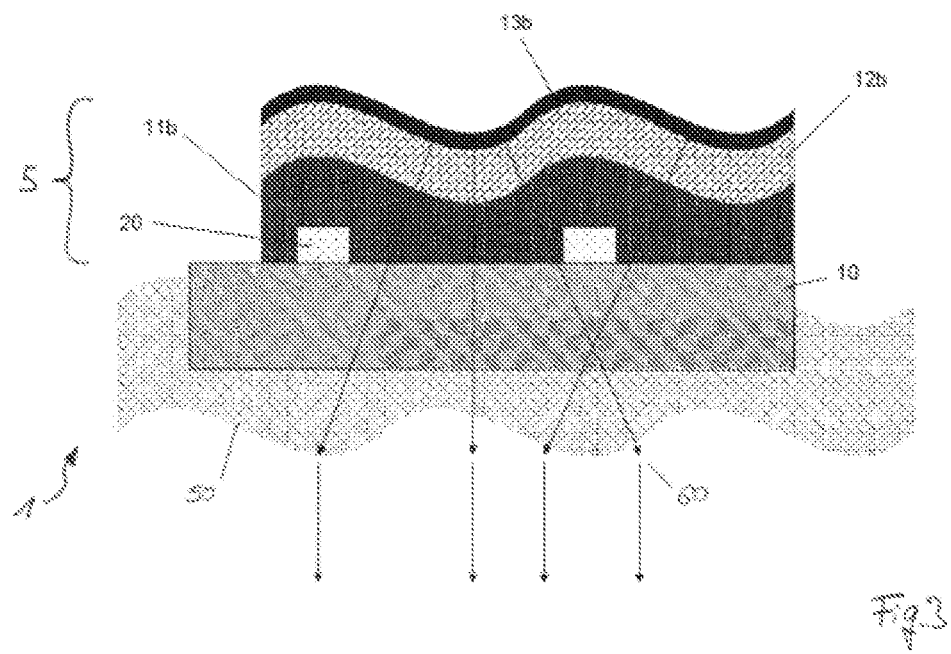
FIG. 3 shows a second exemplary embodiment of a lighting module according to the invention in a lateral sectional illustration.

An advantageous development of the solution according to the invention is illustrated in FIG. 3. In this case, in order to improve the still only poor conductivity of the transparent electrode 11b, an additional structured metal layer in the form of a so-called grid is used. This comprises conductor tracks or metal tracks 20 which are arranged on the surface of the carrier substrate 10 and are embedded in the electrode layer 11b. These tracks 20 of the metal grid are preferably distributed uniformly over the area of the structure in order to achieve a uniform current flow over the entire area and thus to improve the homogenization of the light emission.

On the other hand, such metal tracks or conductor tracks 20 are of course opaque and could correspondingly have a disruptive effect on the light emission of the OLED. In accordance with the invention, provision is therefore made for the wavy or periodic structuring of the transparent electrode layer 11b to correspond to the arrangement of the tracks of the metal grid. In other words, the electrode layer 11b has a greater thickness precisely in those regions in which the conductor tracks 20 of the metal grid 20 are also arranged, as can be seen from the sectional illustration in FIG. 3. In this case, therefore, the structuring preferably has a so-called translation invariance in the direction of the conductor tracks 20, i.e. the wavy nature of the layer results only in the plane of the illustration in FIG. 3, while in a plane perpendicular thereto or in the direction of the conductor tracks 20, the thickness of the electrode layer 11b is unchanged or constant. However, it would also be conceivable for the structuring according to the invention of the electrode layer 11b to be performed two-dimensionally, in particular in cases where no metal grid is used. Then, when the electrode material is applied to the substrate, a perforated mask or the like could be used in place of a grid as shadow mask.

The effect of the structuring of the electrode layer 11b is shown in FIG. 3 using a plurality of light beams 60. It can be seen here that, owing to the structuring of the electrode layer 11b, said electrode layer acts as a lens, to be precise in such a way that the metal tracks of the grid 20 embedded in the electrode layer 11b only result in a low level of shadowing. The light beams 60 are therefore deflected in such a way that they are guided past the conductor tracks 20 out of the active element 5 into the carrier substrate 10. By virtue of the use of an optional, additional optical layer 50 on that side of the carrier substrate 10 which is opposite the active element, the light beams emerging can then be influenced in such a way that they are emitted substantially parallel to one another, as shown in FIG. 3. Ultimately, therefore, the efficiency of the light emission is in this case overall once again markedly optimized since firstly the uniform current flow is optimized with the aid of the grid and secondly the generation of light in the active element 5 is optimized. On the other hand, the structuring according to the invention of the transparent electrode firstly prevents shadowing by the grid and secondly prevents the loss of light owing to total internal reflection.

Finally, it will be mentioned that the solution according to the invention is not restricted to organic LEDs. A comparable problem also results in the case of the QLEDs mentioned at the outset, in which case the light emission can also be optimized by corresponding structuring of the transparent electrode owing to a suppression of total internal reflection at interfaces.

The invention claimed is:

1. A lighting module comprising:
    a plate-shaped, active element, which has two electrode layers and one light-emitting layer arranged between the electrode layers,
    a transparent plate-shaped carrier element, on which the active element is arranged,
    wherein at least the electrode layer facing the carrier element is transparent and has a periodic structuring of varying thickness;
    a metal grid embedded in the transparent electrode layer; and
    an additional optical layer arranged on that side of the carrier element which is opposite the transparent electrode layer to influence the light beams emerging in such a way that they are emitted substantially parallel to one another.

2. The lighting module as claimed in claim 1, wherein the transparent electrode layer is designed to be flat on the side thereof that faces the carrier element.

3. The lighting module as claimed in claim 1, wherein the further layers of the active element have a substantially constant thickness or follow the structure of the transparent electrode layer.

4. The lighting module as claimed in claim 1, wherein both electrode layers are transparent.

5. The lighting module as claimed in claim 4, wherein structuring of the transparent electrode layer corresponds to a structure of the metal grid.

6. The lighting module as claimed in claim 5, wherein the transparent electrode layer has a greater thickness in the region of the conductor or metal tracks of the metal grid.

7. The lighting module as claimed in claim 1, wherein the structuring of the transparent electrode layer is translation-invariant along an axis.

8. The lighting module as claimed in claim 1, wherein the metal grid comprises conductor tracks or metal tracks, which are arranged to allow for a uniform current flow over the active element.

9. The lighting module as claimed in claim 1, wherein the transparent electrode layer is applied by deposition onto the carrier element.

10. The lighting module as claimed in claim 1, wherein said lighting module is an OLED or QLED.

11. A method for constructing a flat lighting module, in which a plate-shaped active element is arranged on a transparent, plate-shaped carrier element, said active element having two electrode layers and a light-emitting layer arranged between the electrode layers, the method comprising:
    arranging a metal grid on a plate-shaped carrier element,
    applying a first transparent electrode layer by deposition onto the metal grid and carrier element to encapsulate the metal grid and form a periodic structuring of varying thickness, and
    applying an additional optical layer arranged on that side of the carrier element which is opposite the first transparent electrode layer to influence the light beams emerging in such a way that they are emitted substantially parallel to one another.

12. The method as claimed in claim 11, further comprising;
    applying an organic light emitting layer onto the transparent electrode layer, and
    applying an second transparent electrode layer on top of the organic light emitting.

* * * * *